(12) United States Patent
Kim et al.

(10) Patent No.: US 12,255,152 B2
(45) Date of Patent: Mar. 18, 2025

(54) SEMICONDUCTOR DEVICE AND METHOD OF FORMING A SLOT IN EMI SHIELDING WITH IMPROVED REMOVAL DEPTH

(71) Applicant: STATS ChipPAC Pte. Ltd., Singapore (SG)

(72) Inventors: ChangOh Kim, Incheon (KR); JinHee Jung, Incheon (KR); JiWon Lee, Seoul (KR); YuJeong Jang, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 18/359,688

(22) Filed: Jul. 26, 2023

(65) Prior Publication Data
US 2023/0369241 A1  Nov. 16, 2023

Related U.S. Application Data

(62) Division of application No. 17/308,410, filed on May 5, 2021, now Pat. No. 11,756,897.

(51) Int. Cl.
| | |
|---|---|
| *H01L 23/552* | (2006.01) |
| *H01L 21/3213* | (2006.01) |
| *H01L 23/31* | (2006.01) |
| *H01L 25/065* | (2023.01) |

(52) U.S. Cl.
CPC ...... *H01L 23/552* (2013.01); *H01L 21/32131* (2013.01); *H01L 23/3107* (2013.01); *H01L 25/0655* (2013.01)

(58) Field of Classification Search
None
See application file for complete search history.

(56) References Cited

U.S. PATENT DOCUMENTS

| | | | |
|---|---|---|---|
| 9,070,793 B2 | 6/2015 | Liao et al. | |
| 9,129,954 B2* | 9/2015 | Yen | H01L 23/552 |
| 9,144,183 B2 | 9/2015 | Chen et al. | |
| 9,153,542 B2 | 10/2015 | Lin et al. | |
| 11,640,944 B2* | 5/2023 | Kim | H01L 23/552 |
| | | | 257/659 |
| 11,869,848 B2* | 1/2024 | Lee | H01L 23/552 |
| 2014/0035097 A1* | 2/2014 | Lin | H01L 23/66 |
| | | | 257/E29.325 |

(Continued)

FOREIGN PATENT DOCUMENTS

| | | |
|---|---|---|
| CN | 105855711 A | 1/2015 |
| CN | 110707072 A | 9/2019 |

(Continued)

*Primary Examiner* — Long Pham
(74) *Attorney, Agent, or Firm* — Brian M. Kaufman; Robert D. Atkins; PATENT LAW GROUP: Atkins and Associates, P.C.

(57) ABSTRACT

A semiconductor device is formed by providing a semiconductor package including a shielding layer and forming a slot in the shielding layer using a laser. The laser is turned on and exposed to the shielding layer with a center of the laser disposed over a first point of the shielding layer. The laser is moved in a loop while the laser remains on and exposed to the shielding layer. Exposure of the laser to the shielding layer is stopped when the center of the laser is disposed over a second point of the shielding layer. A distance between the first point and the second point is approximately equal to a radius of the laser.

23 Claims, 12 Drawing Sheets

(56) References Cited

U.S. PATENT DOCUMENTS

| | | |
|---|---|---|
| 2016/0203888 A1 | 7/2016 | Chen et al. |
| 2017/0117230 A1 | 4/2017 | Kumbhat et al. |
| 2018/0261551 A1 | 9/2018 | Lee et al. |
| 2023/0215721 A1* | 7/2023 | Kim .................... H01L 23/552 134/21 |

FOREIGN PATENT DOCUMENTS

| | | |
|---|---|---|
| JP | 2013058513 A | 9/2011 |
| KR | 20180104557 A | 9/2018 |

* cited by examiner

SEMICONDUCTOR DEVICE AND METHOD OF FORMING A SLOT IN EMI SHIELDING WITH IMPROVED REMOVAL DEPTH

CLAIM OF DOMESTIC PRIORITY

The present application is a division of U.S. patent application Ser. No. 17/308,410, now U.S. Pat. No. 11,756,897, filed May 5, 2021, which application is incorporated herein by reference.

FIELD OF THE INVENTION

The present invention relates in general to semiconductor devices and, more particularly, to a semiconductor device and method of forming a slot in an electromagnetic interference shielding layer over electrical components in a system-in-package (SiP) module with improved removal depth.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) communications, often contain one or more integrated passive devices (IPDs) to perform necessary electrical functions. Multiple semiconductor die and IPDs can be integrated into an SiP module for higher density in a small space and extended electrical functionality. Within the SiP module, semiconductor die and IPDs are mounted to a substrate for structural support and electrical interconnect. An encapsulant is deposited over the semiconductor die, IPDs, and substrate. An electromagnetic shielding layer is commonly formed over the encapsulant.

The SiP module includes high speed digital and RF electrical components, highly integrated for small size, low height, and high clock frequencies. The electromagnetic shielding layer reduces or inhibits EMI, RFI, and other inter-device interference, for example as radiated by high-speed digital devices, from affecting neighboring devices within or adjacent to the SiP module. However, a conformally applied electromagnetic shielding layer by itself may not be effective against EMI loop currents within the shielding material. The EMI current loops can originate from high energy/output devices, such as a power amplifier embodied in one or more of the electrical components. The EMI loop currents flow through the electromagnetic shielding layer and induce EMI, RFI, and other inter-device interference in sensitive neighboring components within or adjacent to the SiP module.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contacts within the package. The electrical connections can be made with conductive layers, bumps, stud bumps, conductive paste, or bond wires. An encapsulant or other molding material is deposited over the package to provide physical support and electrical isolation. The finished package is then inserted into an electrical system and the functionality of the semiconductor device is made available to the other system components.

Figure 1A:
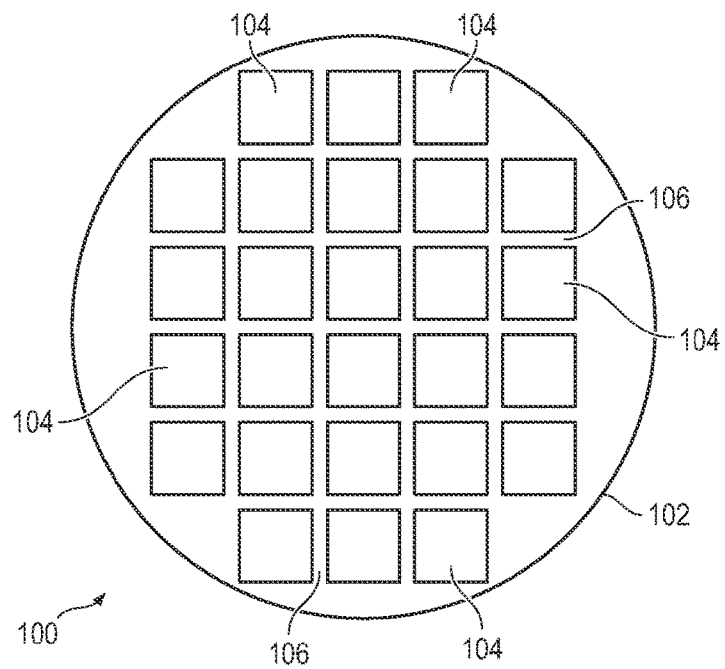
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
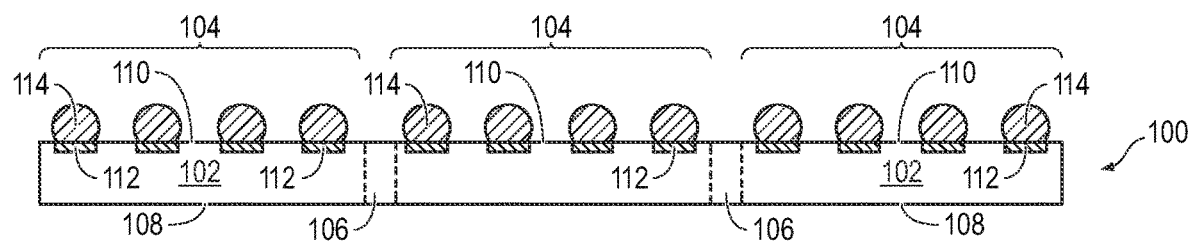

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), power amplifier, application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, combinations thereof, or other suitable conductive materials with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
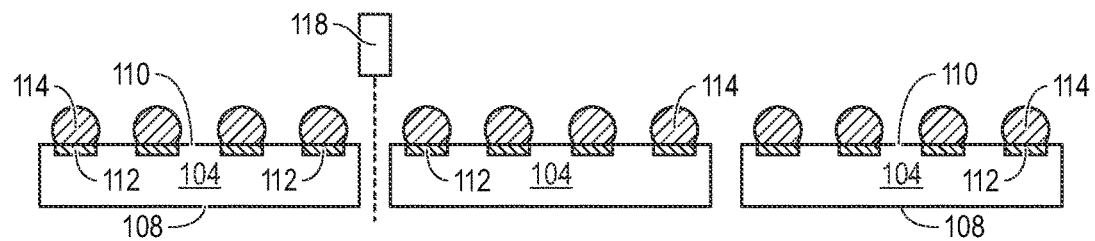

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known-good die (KGD) post singulation.

Figure 2A:
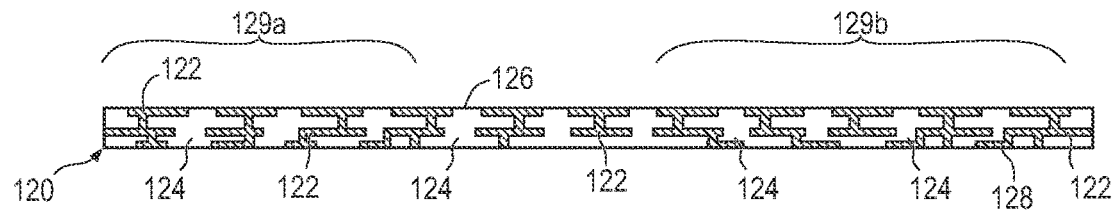
FIGS. 2a-2k illustrate a process of disposing electronic components on a substrate in an SiP module with a slotted electromagnetic shielding layer.

FIGS. 2*a*-2*k* illustrate a process of disposing electrical components over an interconnect substrate to form an SiP module with a slotted electromagnetic shielding layer. FIG. 2*a* shows a cross-sectional view of interconnect substrate 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of the SiP module being formed. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 124 provides isolation between conductive layers 122. Any suitable type of substrate or leadframe is used for substrate 120 in other embodiments.

Figure 2B:
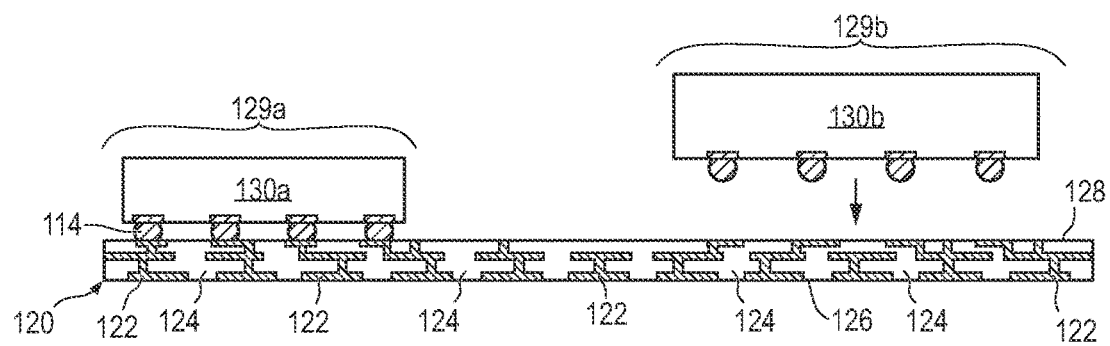
Figure 2C:
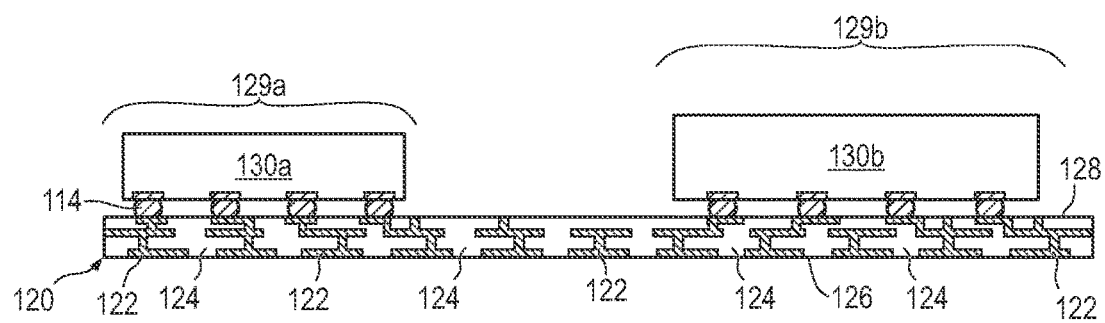

In FIG. 2*b*, electrical components 130*a* and 130*b* are mounted to surface 128 of interconnect substrate 120 and electrically and mechanically connected to conductive layers 122 by bumps 114. Electrical components 130*a* and 130*b* are each positioned over substrate 120 using a pick and place operation. For example, electrical component 130*a* and 130*b* can be semiconductor die 104 from FIG. 1*c* with active surface 110 and bumps 114 oriented toward surface 128 of substrate 120 over component attach areas 129*a* and 129*b*. Alternatively, electrical components 130*a* and 130*b* can include other semiconductor die, semiconductor packages, surface mount devices, power amplifier, discrete electrical devices, or IPDs, such as a resistor, capacitor, and inductor. Any number and type of components can be mounted as desired.

Figure 2D:
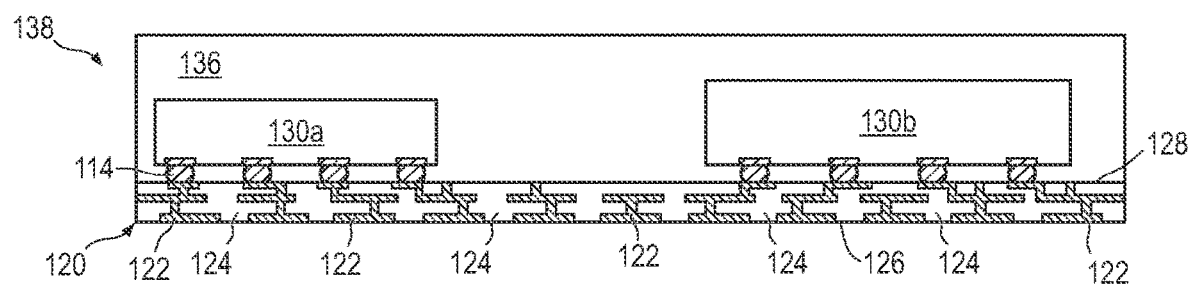

In FIG. 2*d*, an encapsulant or molding compound 136 is deposited over and around electric component 130*a*, electrical component 130*b*, and substrate 120 using a paste printing, compressive molding, transfer molding, liquid encapsulant molding, vacuum lamination, spin coating, or other suitable applicator. Encapsulant 136 can be a polymer composite material, such as epoxy resin, epoxy acrylate, or polymer with or without a filler. Encapsulant 136 is non-conductive, provides structural support, and environmentally protects the semiconductor device from external elements and contaminants. Electrical components 130*a* and 130*b* as mounted to interconnect substrate 120 and covered by encapsulant 136 constitute SiP module 138.

Figure 2E:
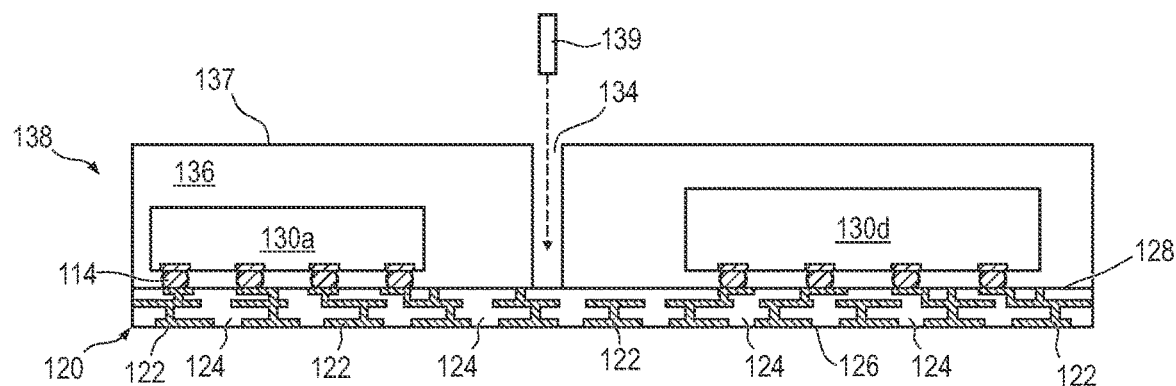
Figure 2F:
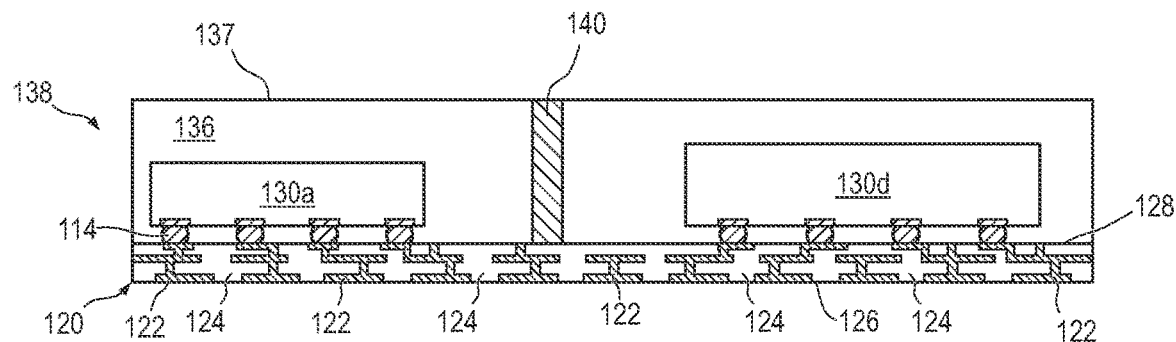

In FIG. 2*e*, a plurality of vias 134 is formed into surface 137 of encapsulant 136 using etching, drilling, or laser direct ablation (LDA) with laser 139. Vias 134 are aligned with and extend to portions of conductive layer 122 on interconnect substrate 120. In FIG. 2*f*, vias 134 are filled with Al, Cu, Sn, Ni, Au, Ag, titanium (Ti), tungsten (W), polysilicon, combinations thereof, or other suitable electrically conductive material using paste printing and reflow, electrolytic plating, electroless plating process, or other suitable metal deposition process to form z-direction vertical conductive posts 140. Conductive posts 140 are electrically connected to conductive layer 122. Conductive posts 140 can be formed over conductive layer 122 of substrate 120 prior to encapsulant 136. In this case, encapsulant 136 would be deposited over conductive posts 140.

Electrical components 130*a* and 130*b* may contain IPDs that are susceptible to or generate EMI, RFI, harmonic distortion, and inter-device interference. For example, the IPDs contained within electrical components 130*a* and 130*b* provide the electrical characteristics needed for high-frequency applications, such as resonators, high-pass filters, low-pass filters, band-pass filters, symmetric Hi-Q resonant transformers, and tuning capacitors. In another embodiment, electrical components 130*a* and 130*b* contain digital circuits switching at a high frequency, which could interfere with the operation of IPDs in the SiP module.

Figure 2G:
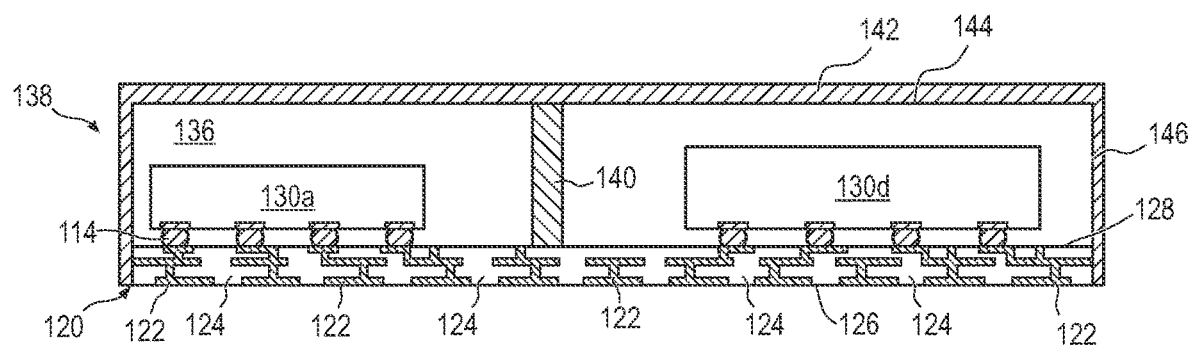

In FIG. 2*g*, electromagnetic shielding layer 142 is formed or disposed over surface 144 of encapsulant 136 by conformal application of shielding material. Shielding layer 142 can be one or more layers of Al, Cu, Sn, Ni, Au, Ag, or other suitable conductive material. Alternatively, shielding layer 142 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. In addition, shielding layer 142 covers side surfaces 146 of encapsulant 136, as well as the side surface of substrate 120.

SiP module 138 includes high speed digital and RF electrical components 130a and 130b, which are highly integrated for small size, low height, and operating at high clock frequencies. Electromagnetic shielding layer 142 reduces or inhibits EMI, RFI, and other inter-device interference, for example as radiated by high-speed digital devices, from affecting neighboring devices within or adjacent to SiP module 138. However, a conformally applied electromagnetic shielding layer 142 by itself may not be effective against EMI loop currents within the shielding material. The EMI current loops can originate from high energy/output devices, such as a power amplifier embodied in one or more of electrical components 130a and 130b. The EMI loop currents flow through electromagnetic shielding layer 142 and induce EMI, RFI, and other inter-device interference in sensitive neighboring components within or adjacent to SiP module 138. As an example, loop currents through shielding layer 142 injected by component 130a could potentially flow over and cause interference in component 130b.

Figure 2H:
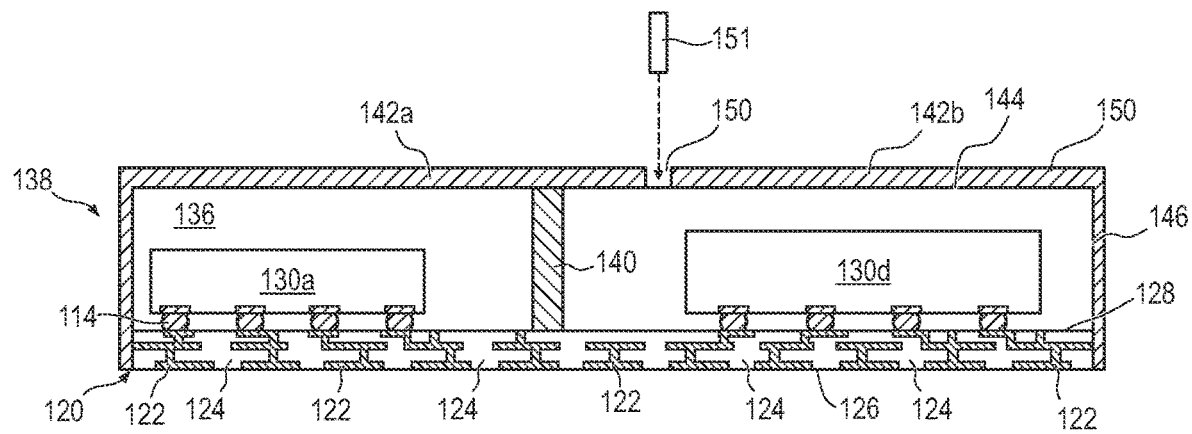
Figure 2I:
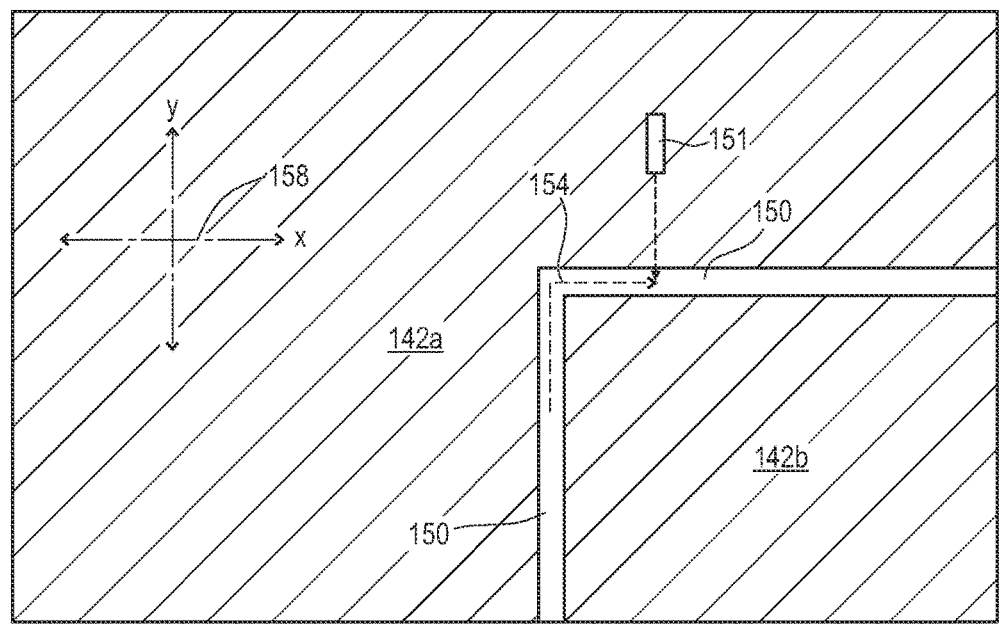

To neutralize or block EMI loop currents, a slot, channel, or trench 150 is formed in electromagnetic shielding layer 142 using laser cutting or laser direct ablation (LDA) with laser 151, as shown in FIG. 2h. Slot 150 completely cuts through electromagnetic shielding layer 142. That is, slot 150 extends at least to encapsulant 136 or extends partially into the encapsulant to completely cut through electromagnetic shielding layer 142. FIG. 2i is a top view of SiP module 138 with slot 150 formed to electrically isolate main body portion 142a from corner portion 142b of electromagnetic shielding layer 142. Slot 150 creates an electrical open or disjunction between shielding portion 142a of electromagnetic shielding layer 142 and shielding portion 142b. EMI loop currents cannot flow across slot 150 between shielding portion 142a and shielding portion 142b, or vice versa. There is no conduction path between the shielding portion 142a and shielding portion 142b. Slot 150 provides an additional layer of protection by electrically isolating shielding portion 142a from shielding portion 142b to reduce or inhibit EMI, RFI, and other inter-device interference in sensitive neighboring components within or adjacent to SiP module 138.

Figure 2J:
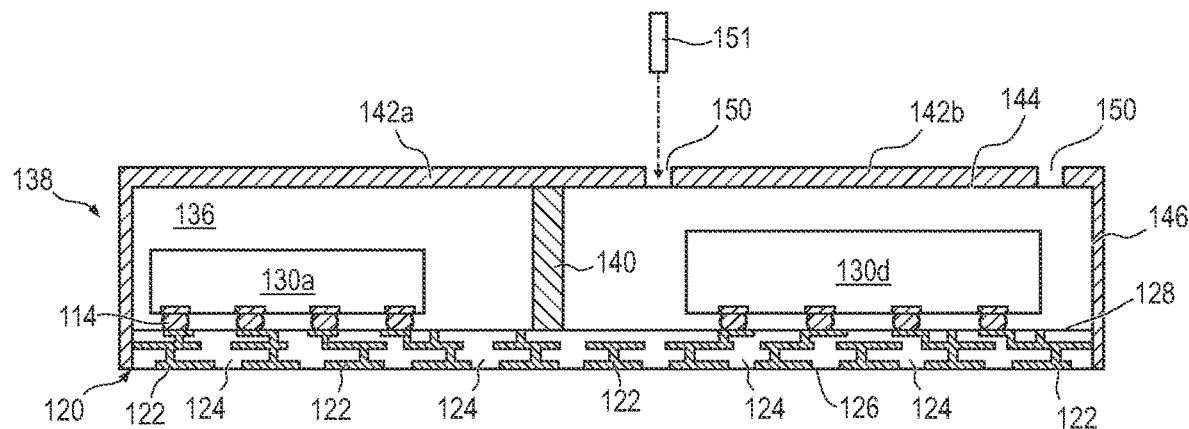
Figure 2K:
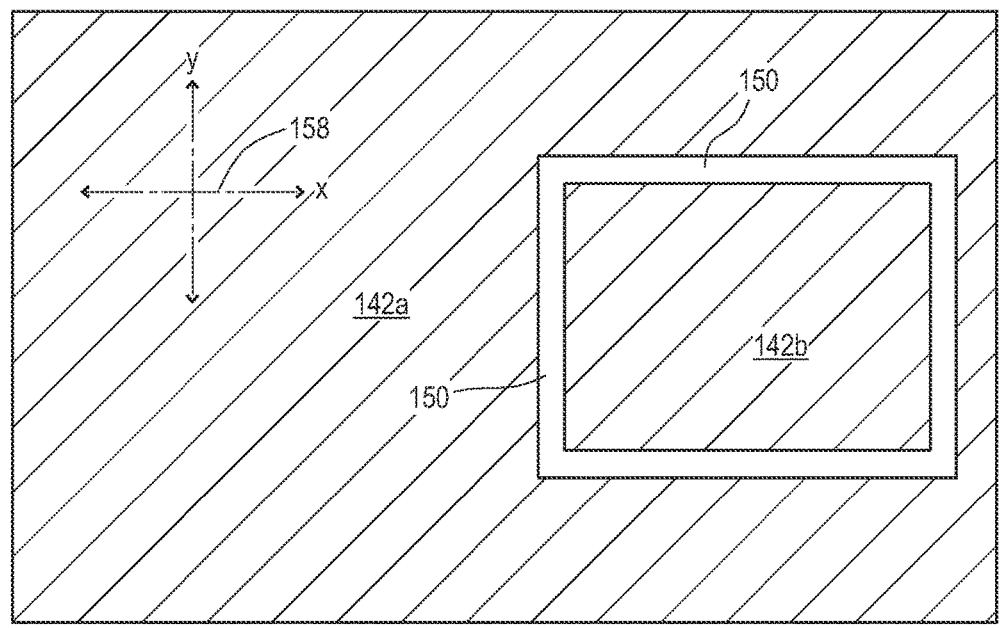

In another embodiment, slot 150 is formed as a continuous loop in electromagnetic shielding layer 142 using laser cutting or LDA with laser 151, as shown in FIG. 2j. Slot 150 completely cuts through electromagnetic shielding layer 142. That is, slot 150 extends at least to encapsulant 136 or extends partially into the encapsulant to complete cut through electromagnetic shielding layer 142. FIG. 2k is a top view of SiP module 138 with slot 150 formed to electrically isolate main body portion 142a from interior island portion 142b of electromagnetic shielding layer 142. Slot 150 creates an electrical open or disjunction between shielding portion 142a of electromagnetic shielding layer 142 and shielding portion 142b. EMI loop currents cannot flow across slot 150 between shielding portion 142a and shielding portion 142b, or vice versa. There is no conduction path between the shielding portion 142a and shielding portion 142b. Slot 150 provides an additional layer of protection by electrically isolating shielding portion 142a from shielding portion 142b to reduce or inhibit EMI, RFI, and other inter-device interference in sensitive neighboring components within or adjacent to SiP module 138.

One issue that can negatively impact the quality of the final SiP module is when slot 150 is not formed with a uniform depth. If certain areas of slot 150 are inadvertently formed too deep into encapsulant 136, there is a risk that the underlying components can be damaged. One place where the slot depth can be difficult to control is where laser 151 has to travel around sharp 90-degree corners while drawing out the path of slot 150.

Pathway 154 in FIG. 2i shows where laser 151 has to make a sharp turn to create slot 150. The logistics of how the position of laser 151 is controlled means that the motion of the laser is likely to hiccup at corner 156. There are usually two separate mechanisms for movement in the Y direction and in the X direction, as illustrated by axis 158. When a corner is reached, movement of one of the movement mechanisms must fully stop and movement of the other mechanism begins to take laser 151 in another direction. The starting and stopping of movement means that laser 151 is hard to turn without stopping at corner 156 for at least a brief moment. The brief delay that laser 151 takes in turning corner 156 causes the laser to dig deeper into encapsulant 136 in the corner compared to in areas where the laser travels in constant linear motion.

Figure 3A:
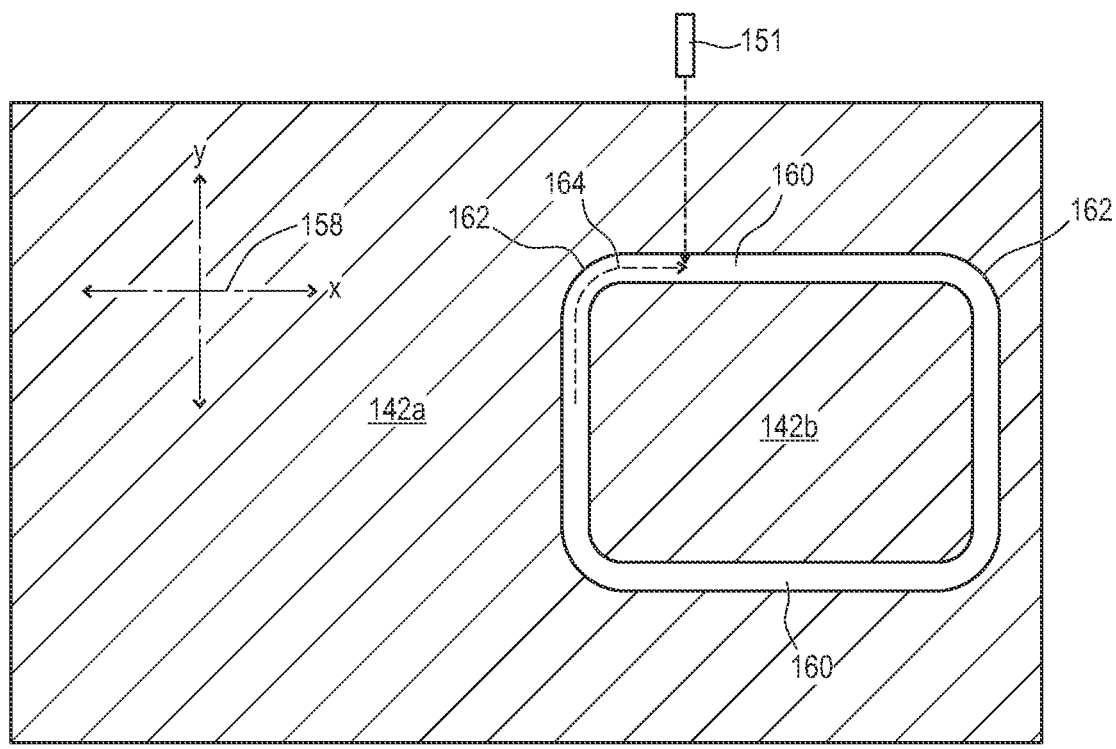
FIGS. 3a and 3b illustrate utilizing a corner radius to improve mold removal depth at the slot corners.
Figure 3B:
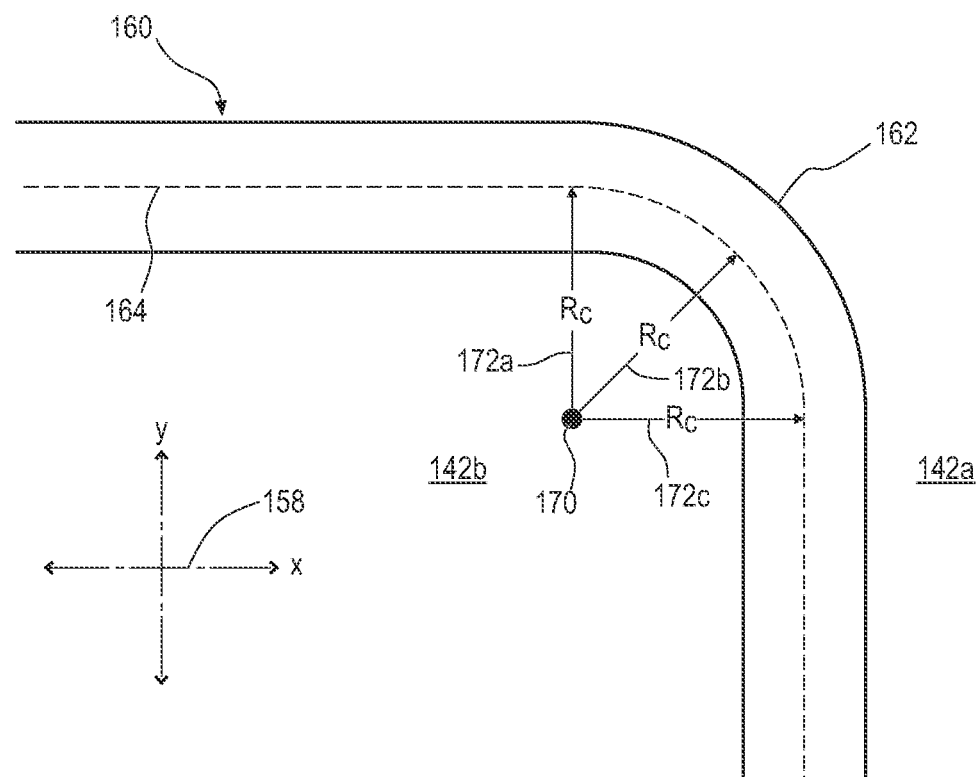

FIGS. 3a and 3b illustrate a method for increasing slot depth uniformity by applying a radius to the corners of slots rather than having sharp corners. FIG. 3a shows slot 160 being formed with rounded corners 162. Pathway 164 illustrates the path that laser 151 takes as the laser rounds a corner 162 to form slot 160. Applying a radius to corners 162 means that there is no longer a sudden stop and start of motion at the slot corners. Laser 151 can smoothly transition from motion in the Y direction to motion in the X direction, and vice versa, over a distance determined by the specific radius used. By comparison, the square corners of FIG. 2k have laser 151 changing direction on essentially a single point.

In the case where two separate mechanisms are used to move laser 151 in the X direction and Y direction, each mechanism is allowed to smoothly transition between being in motion and being stopped rather than the abrupt transition in FIG. 2k. As laser 151 moves along pathway 164 in FIG. 3a, movement in the Y direction transitions from positive movement while the laser is moving vertically on the page to being stopped while the laser is moving horizontally. At the same time, movement in the X direction transitions from being stopped while the laser is moving vertically to positive movement while the laser is moving horizontally. Both X-direction movement and Y-direction movement transition over the entire curve of corners 162.

FIG. 3b shows a detailed view of a corner 162 while laser 151 transitions from positive X-direction movement to negative Y-direction movement. The radius $R_C$ being applied to corner 162 is illustrated. Corner 162 forms a circular arc around a point 170. Point 170 is the distance of radius $R_C$ from each point of the curve of corner 162. Arrows 172a, 172b, and 172c illustrate the same distance between three different points along path 164 around corner 162. In other embodiments, corner 162 is rounded but not exactly circular. Applying a corner radius to the formation of slot 160 results in the same or a similar removal depth for corners 162 as within the straightaways between corners. The uniform slot depth reduces the likelihood that components under slot 160 will be damaged by laser 151.

Another area where removal of material by laser 151 can be non-uniform is where the end of the laser's path in forming a slot meets with the beginning of the laser's path. The ending of the laser's path typically overlaps the beginning to ensure that the slot forms a closed loop. However, exposing the overlapping portion of a slot to laser 151 two times results in an increased depth of the slot at that point. The double exposure also potentially causes damage that expands horizontally, which not only damages the surrounding shielding layer but also potentially damages underlying components within a wider area.

To solve the problem, laser 151 can be controlled to have an end point that does not overlap the beginning point. Achieving a non-overlapping path is accomplished by having a distance from the laser's end point to the laser's beginning point equal to or approximately equal to the radius of the light beam emitted by laser 151. Laser 151 emits light in transverse electromagnetic mode 00 ($TEM_{00}$). Therefore, energy from laser 151 hitting shielding layer 142 has an approximately gaussian distribution as shown in FIG. 4a.

Figure 4A:
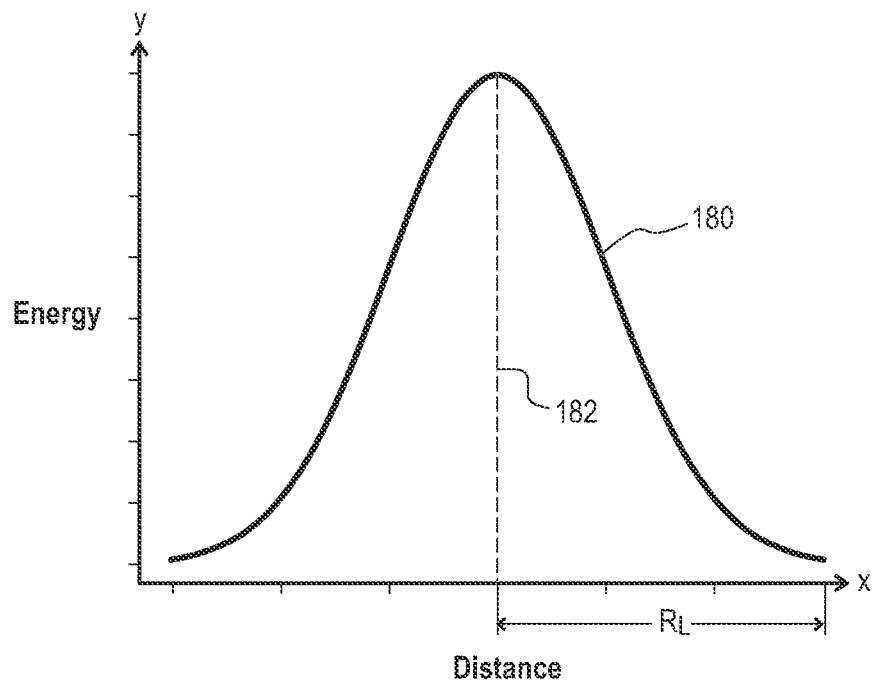
FIGS. 4a-4c illustrate forming the slot without overlapping the start and stop points.

FIG. 4a shows energy distribution of the beam from laser 151 as a plot 180, where the Y axis represents the energy level and the X axis represents distance. Energy from laser 151 is strongest at the center 182 of the laser's beam and is reduced as the distance from the center increases. The radius $R_L$ of the beam from laser 151 is considered to be the distance from center 182 to the point on the X-axis where the energy level reaches nearly zero.

Figure 4B:
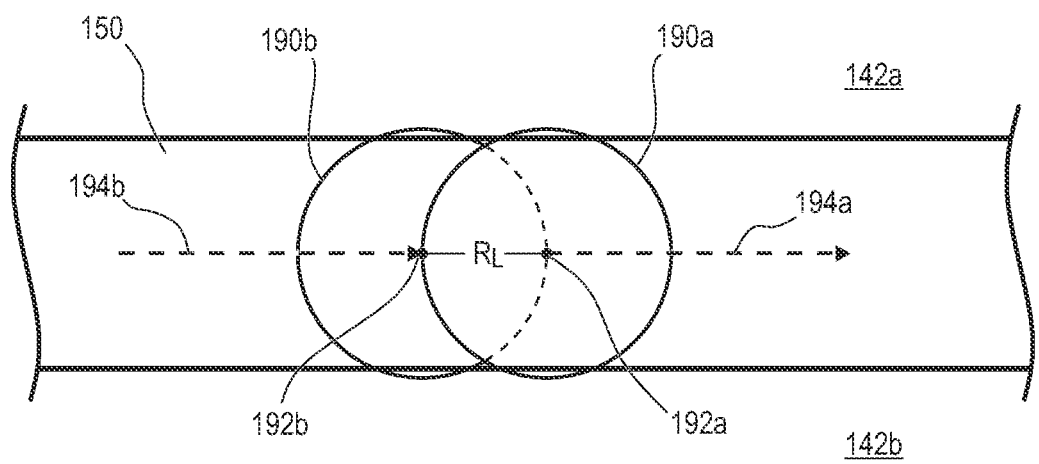

FIG. 4b shows the footprint 190a of the laser beam from laser 151 at the beginning of forming slot 150 superimposed on footprint 190b of the laser beam at the end of forming the slot. When forming slot 150, laser 151 begins with center 182 of the laser beam at point 192a, follows a complete circuit around the slot's loop, and ends with the center of the laser beam at point 192b. Arrow 194a illustrates the movement of laser 151 when formation of slot 150 starts, and arrow 194b illustrates the movement of the laser as the slot is completed.

The distance between start point 192a of laser 151 and stop point 192b is approximately equal to the radius $R_L$ of the laser beam. For instance, if the laser diameter is 20 microns (μm), then the distance between points 192a and 192b would be 10 μm. Therefore, the footprint 190a exposed to laser 151 at the beginning of slot formation overlaps partially with the footprint 190b exposed to the laser at the end of slot formation. However, the beginning energy peak at point 192a only overlaps a relatively low-energy area of footprint 190b. Similarly, ending point 192b overlaps only a relatively low energy area of footprint 190a.

Figure 4C:
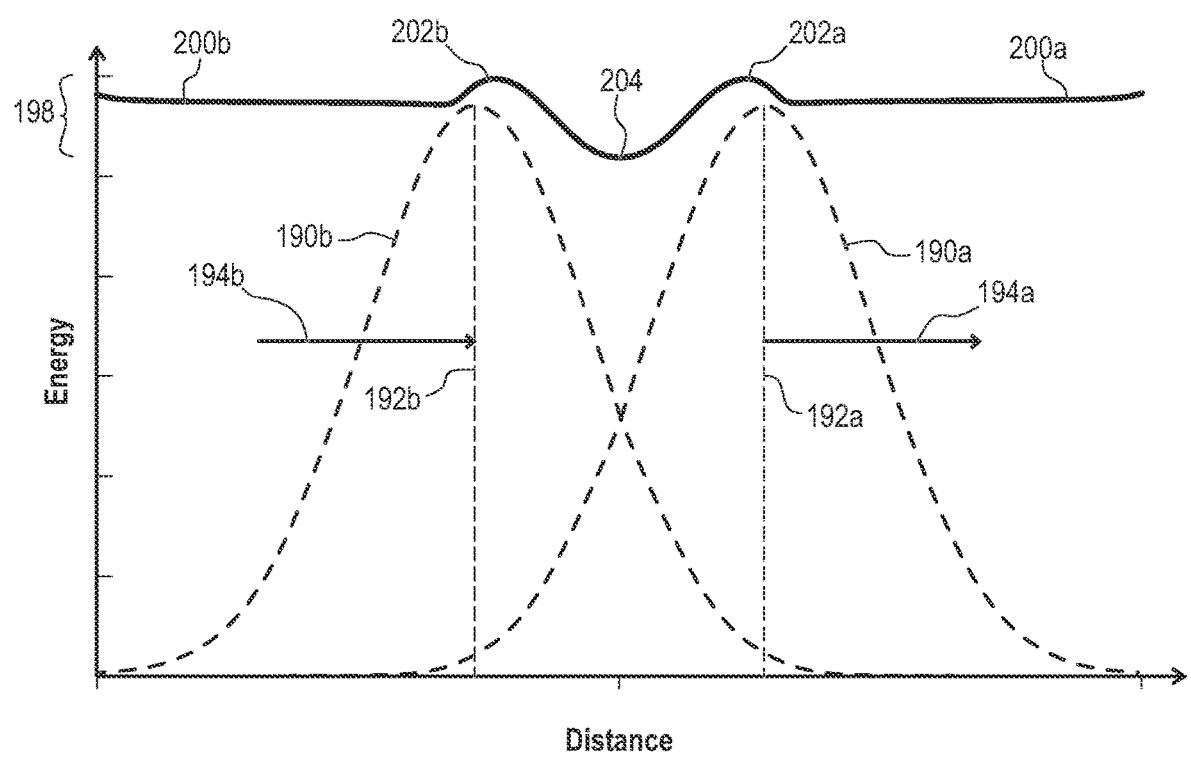

FIG. 4c illustrates the amount of energy each area of slot 150 receives from laser 151 when the spacing from FIG. 4b is used. A plot 198 shows the overall amount of energy received, while the representations of starting footprint 190a and ending footprint 190b illustrate the amount of energy received at the time when laser 151 is at the starting and ending positions, respectively. The overall energy level 198 is basically flat to the right of footprint 190a in area 200a and to the left of footprint 190b in area 200b, where laser 151 simply sweeps by with a constant power output. The overall power 198 has two minor peaks 202a and 202b where footprints 190a and 190b overlap near their respective peaks, and a valley 204 where both laser footprints are under half power. Even though the power output of laser 151 is not absolutely constant for the entirety of slot 150 formation, the power is relatively constant compared to a manufacturing process that forms the slot by fully overlapping ending point 192a and beginning point 192b. The power output stays high enough for the entire slot loop to fully remove shielding layer 142 but does not go high enough in the overlap to cause significant damage to underlying components.

Figure 5A:
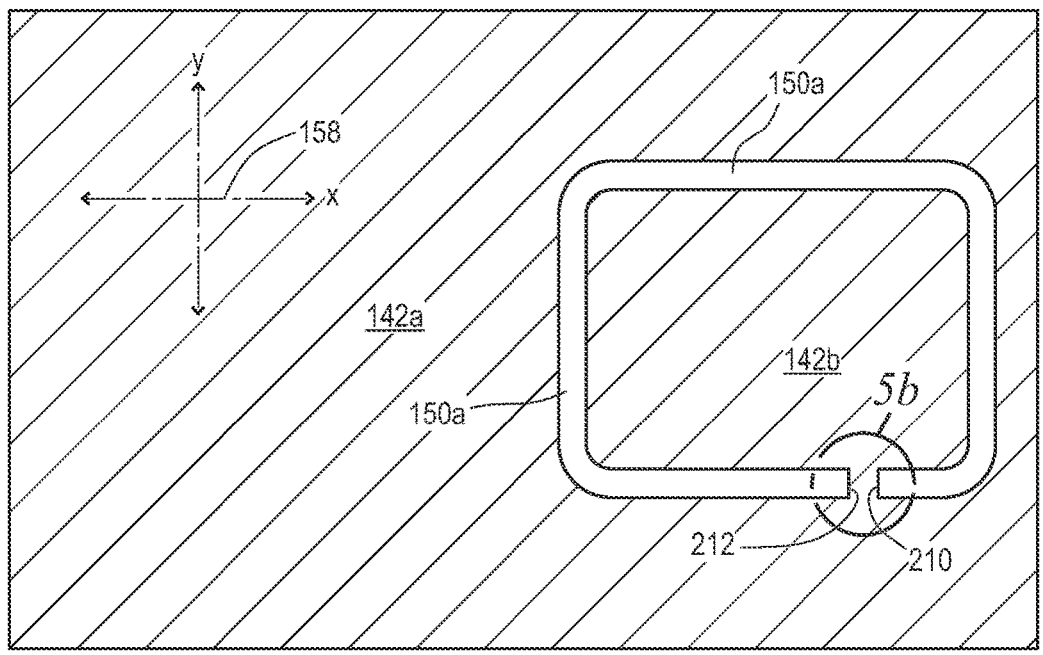
FIGS. 5a-5c illustrate forming the slot without overlapping the start and stop points using a two-step process.
Figure 5B:
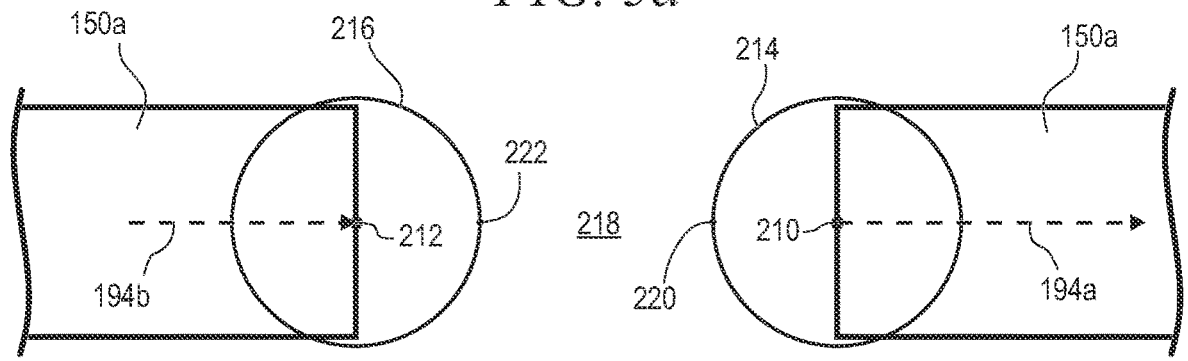
Figure 5C:
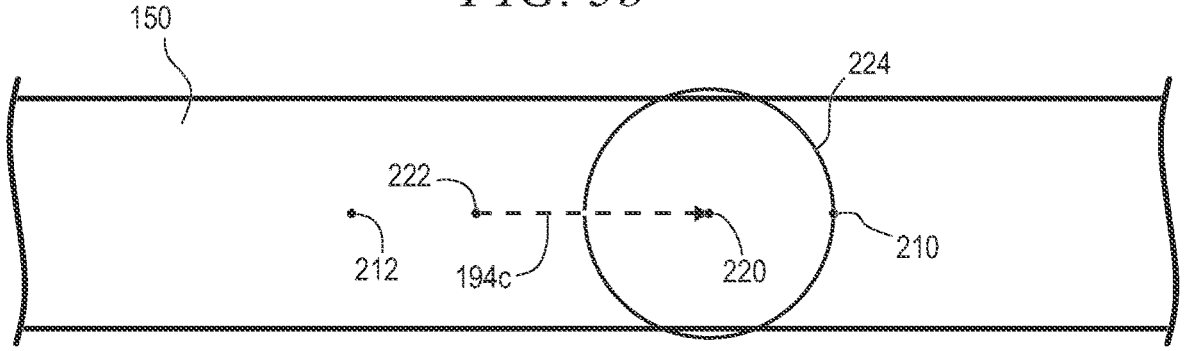

The process in FIGS. 4a-4c requires highly accurate laser control to be able to start and stop laser 151 within a half of the laser beam's diameter. Such a high level of control may not be possible with all laser control systems at a high enough speed to be useful in manufacturing. Another option is shown in FIGS. 5a-5c. Initially, in FIGS. 5a and 5b, laser 151 is used to form slot 150a from start point 210 to end point 212. A footprint 214 of laser 151 exists around beginning point 210 and a footprint 216 of laser 212 at end point 212.

A gap 218 exists between point 220 and point 222 on the circumference of footprints 210 and 212, respectively, such that the beginning and ending footprints of laser 151 do not overlap at all. The distance between points 220 and 222 can be any suitable amount. One mechanism for leaving gap 218 between the start and stop points is by utilizing laser on and off control. Typically, laser 151 will be on for some period of time before being exposed to shielding layer 142, which is the laser on-delay. The laser will also typically remain on for some period of time after slot 150 is complete, which is the laser off-delay. During the on-delay and off-delay, laser 151 is on and generating a beam, but the beam is not allowed to irradiate onto shielding layer 142. Typical timings might be an on-delay of 10 microseconds (μs) and an off-delay of 100 μs, although any timing can be used. With a short on-delay and a long off-delay, the start and stop points will be likely to meet. If the timings are changed to include a long on-delay and a short off-delay, the start and stop points are likely to leave gap 218.

Laser 151 forms slot 150a at a relatively high rate of speed and power level to form the slot relatively quickly. However, the relatively high speed makes overlapping by exactly one radius, as shown in FIGS. 4a-4c, difficult. After forming slot 150a with gap 218, the gap is closed using laser 151 at a lower speed and a lower power output to have more precise control over the start and stop points.

The second laser phase, which closes gap 218, is shown in FIG. 5c. In the second phase, laser 151 goes from centered on point 222 to centered on point 220. The overlap between the laser at point 222 and footprint 216 is approximately or exactly equal to the laser beam's radius, similar to the illustration shown in FIG. 4b. The overlap between the laser at point 220 and footprint 214 is approximately or exactly equal to the laser beam's radius as well. Therefore, the overall power profile at the beginning and end of gap 218 is similar to the profile shown in FIG. 4c. The second phase of laser etching shown in FIG. 5c is done at a slower speed so precise start and end points are easier. In addition, the short distance of gap 218 relative to the entire slot means that the slow speed does not have as big of an impact on overall production time.

Figure 6A:
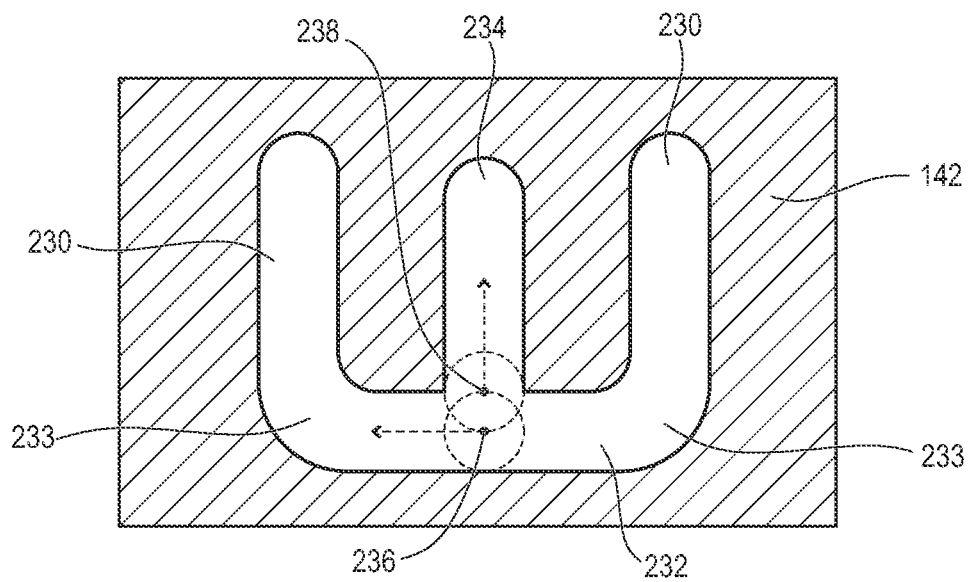
FIGS. 6a and 6b illustrate slots with perpendicular overlaps.

While looped slots 150 are shown above, where the beginning and end meet in an overlap, the same basic manufacturing principles apply to any slot design with an overlap. In addition to end-to-end overlap as just discussed, another common type of overlap is when slot lines meet at a perpendicular angle. FIG. 6a shows an E-shaped slot design. The E-shape includes two outer tines 230 and a back 232 that form a bracket shape. Tines 230 and back 232 can be formed by laser 151 in one continuous motion, utilizing radiused turns at corners 233.

The E-shaped slot further includes a middle tine 234 that is formed extending from back 232 at a 90-degree angle.

Tine 234 is formed in a separate motion from tines 230 and back 232. Laser 151 is either turned off or obscured so that the laser is not irradiated onto shielding layer 142 while the laser is moved from the end point of tine 230 to the beginning point of tine 234, or vice versa. Tines 230, tines 234, and back 232 can be considered as a single E-shaped slot that is simply formed in two discrete and connected portions. Tine 234 is formed by laser 151 overlapping the path used to form back 232. Point 236 is the center of the beam from laser 151 forming back 232. Point 238 is on the circumference of that laser footprint and is where the center of laser 151 is placed when beginning or ending the formation of middle tine 234. Overlapping back 232 by exactly or approximately the radius of laser 151 when forming middle tine 234 results in tine 234 being properly formed without significantly increasing the overall laser power exposed to back 232. In other embodiments, tine 234 is formed prior to back 232, but the same radius overlapping distance applies.

Figure 6B:
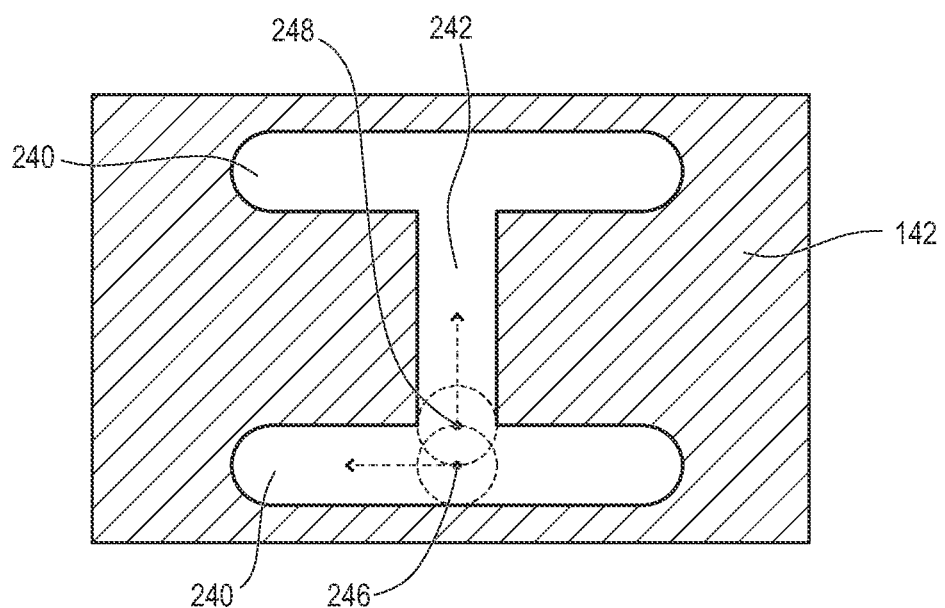

FIG. 6b shows an H-shaped slot with two sides 240 connected by a crossbar 242. The center of laser 151 crosses through point 246 when forming side 240. When forming crossbar 242, laser 151 begins at point 248 on the circumference of the laser's footprint from when side 240 was formed. Laser 151 also ends once the laser beam's footprint overlaps the opposite end 240 by the laser's radius. The concept of overlapping by half the laser's diameter can apply to any slot design with an overlap. The slots can also be T-shaped, F-shaped, P-shaped, or any other shape with a slot overlap.

Figure 7A:
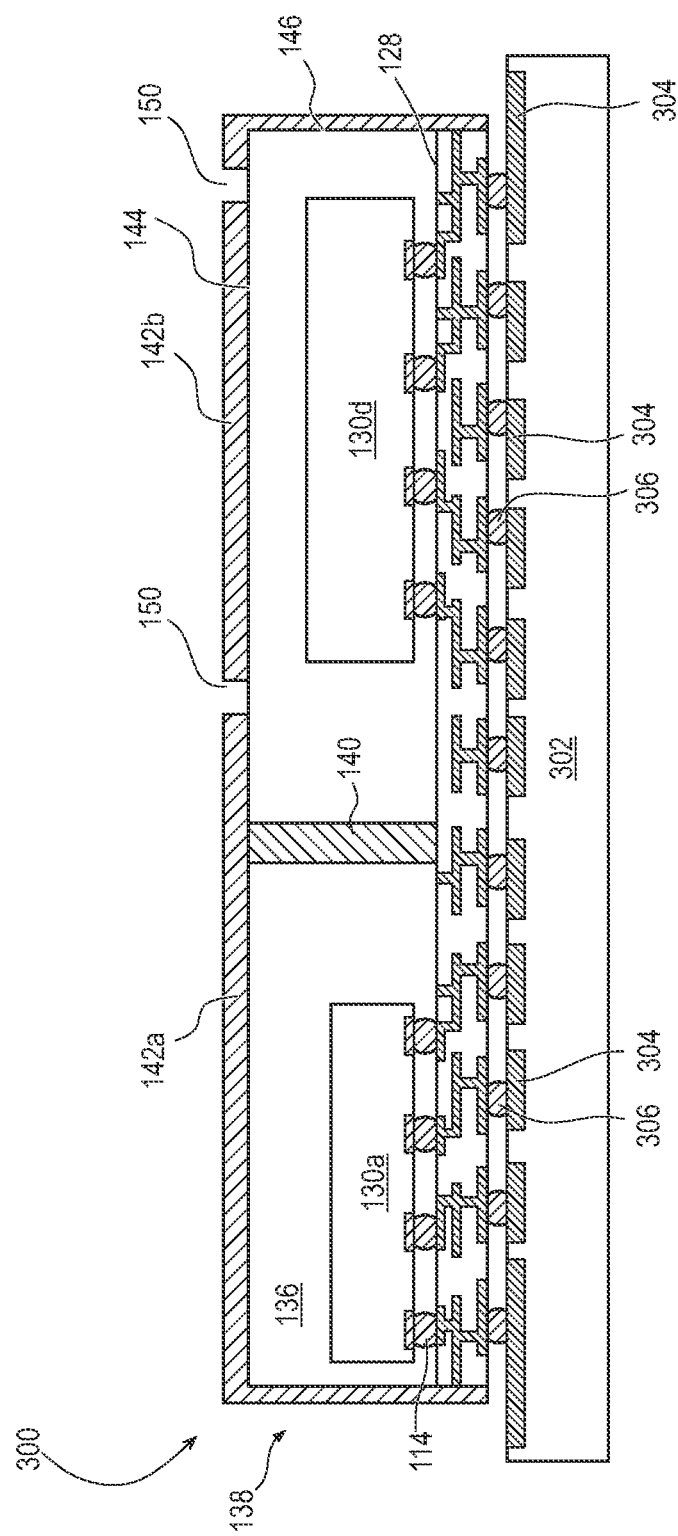
FIGS. 7a and 7b illustrate integrating the slotted SiP module into an electronic device.
Figure 7B:
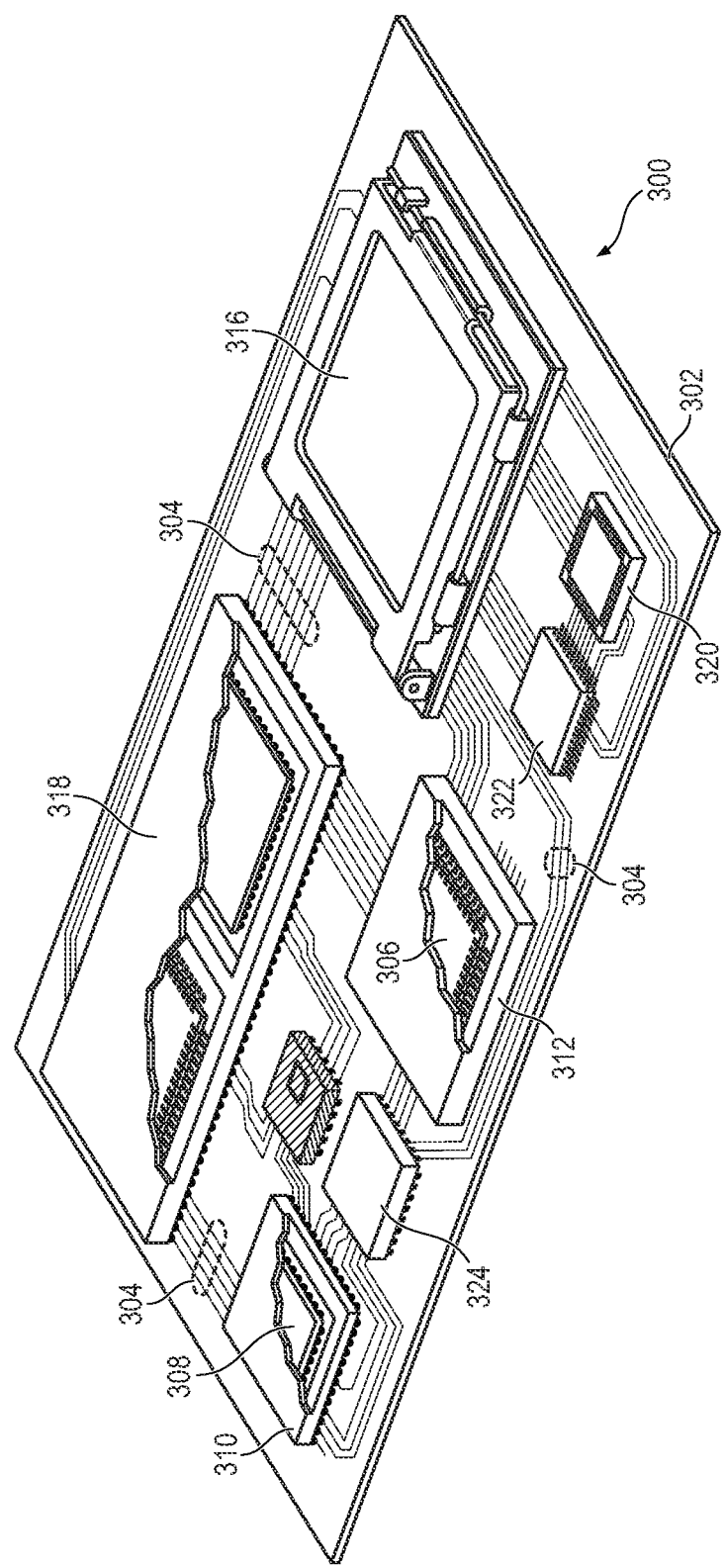

FIGS. 7a and 7b illustrate incorporating the above-described packages, e.g., SiP module 138, into an electronic device 300. FIG. 7a illustrates a partial cross-section of SiP module 138 mounted onto a printed circuit board (PCB) or other substrate 302 as part of electronic device 300. Bumps 306 are formed on conductive layer 122 on the bottom of substrate 120. Conductive bumps 306 can be formed at any stage of the manufacturing process, e.g., prior to molding encapsulant 136, prior to singulation, or after forming and patterning shielding layer 142. Bumps 306 are reflowed onto conductive layer 304 of PCB 302 to physically attach and electrically connect SiP module 138 to the PCB. In other embodiments, thermocompression or other suitable attachment and connection methods are used. In some embodiments, an adhesive or underfill layer is used between SiP module 138 and PCB 302. Components 130a and 130b are electrically coupled to conductive layer 304 through substrate 120 and bumps 306.

FIG. 7b illustrates electronic device 300 with a plurality of semiconductor packages mounted on a surface of PCB 302, including SiP module 138. Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, and other semiconductor die or electrical components.

In FIG. 7b, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) 318, quad flat non-leaded package (QFN) 320, quad flat package 322, and eWLB 324 are shown mounted on PCB 302 along with SiP module 138. Conductive traces 304 electrically couple the various packages and components disposed on PCB 302 to SiP module 138, giving use of the components within SiP module 138 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
a substrate;
a first semiconductor die disposed over the substrate;
a second semiconductor die disposed over the substrate;
a conductive post disposed over the substrate between the first semiconductor die and second semiconductor die;
an encapsulant deposited over the substrate;
a shielding layer formed over the encapsulant and on the conductive post; and
a first slot formed in the shielding layer over the first semiconductor die, wherein the first slot includes,
a first linear portion,
a second linear portion oriented perpendicular to the first linear portion, and a curved portion connecting the first linear portion and the second linear portion.

2. The semiconductor device of claim 1, wherein the first slot forms an incomplete loop with a gap between a first end of the loop and a second end of the loop.

3. The semiconductor device of claim 1, further including a second slot extending from the first slot perpendicularly.

4. The semiconductor device of claim 3, further including a third slot extending parallel to the first slot with the second slot extending from the first slot to the third slot.

5. The semiconductor device of claim 1, wherein the curved portion forms a radiused corner for the first slot.

6. The semiconductor device of claim 1, wherein the first slot is formed as a completed loop.

7. A semiconductor device, comprising:
a substrate;
a first semiconductor die disposed over the substrate;
an encapsulant deposited over the substrate;
a shielding layer formed over the encapsulant; and
a first slot formed in the shielding layer over the first semiconductor die, wherein the first slot forms an incomplete loop with a gap between a first end of the loop and a second end of the loop.

8. The semiconductor device of claim 7, further including a second slot extending from the first slot perpendicularly.

9. The semiconductor device of claim 8, further including a third slot extending parallel to the first slot with the second slot extending from the first slot to the third slot.

10. The semiconductor device of claim 7, wherein the first slot includes a rounded corner.

11. The semiconductor device of claim 7, further including:
a second semiconductor die disposed over the substrate; and
a conductive post disposed over the substrate between the first semiconductor die and second semiconductor die.

12. The semiconductor device of claim 11, wherein the conductive post extends from the substrate to the shielding layer.

13. A semiconductor device, comprising:
a substrate;
an encapsulant deposited over the substrate;
a shielding layer formed over the encapsulant; and
a first slot formed in the shielding layer, wherein the first slot includes,
a first linear portion,
a second linear portion oriented perpendicular to the first linear portion, and
a curved portion connecting the first linear portion and the second linear portion.

14. The semiconductor device of claim 13, wherein the first slot forms an incomplete loop with a gap between a first end of the loop and a second end of the loop.

15. The semiconductor device of claim 13, further including a second slot extending from the first slot perpendicularly.

16. The semiconductor device of claim 15, further including a third slot extending parallel to the first slot with the second slot extending from the first slot to the third slot.

17. The semiconductor device of claim 13, wherein the curved portion forms a radiused corner for the first slot.

18. The semiconductor device of claim 13, further including a conductive post extending from the substrate to the shielding layer.

19. A semiconductor device, comprising:
an encapsulant;
a shielding layer formed over the encapsulant; and
a first slot formed in the shielding layer, wherein the first slot forms an incomplete loop with a gap between a first end of the loop and a second end of the loop.

20. The semiconductor device of claim 19, further including a second slot extending from the first slot perpendicularly.

21. The semiconductor device of claim 19, wherein the first slot includes a rounded corner.

22. The semiconductor device of claim 19, further including:
a first semiconductor die disposed in the encapsulant;
a second semiconductor die disposed in the encapsulant; and
a conductive post disposed between the first semiconductor die and second semiconductor die.

23. The semiconductor device of claim 19, wherein the shielding layer is formed directly on the conductive post.

* * * * *